United States Patent
Rasa et al.

(10) Patent No.: US 8,444,028 B2
(45) Date of Patent: May 21, 2013

(54) DEVICE FOR EJECTING DROPLETS OF A FLUID HAVING A HIGH TEMPERATURE

(75) Inventors: Mircea V. Rasa, Eindhoven (NL); Ronald Berkhout, Maasbree (NL); Wilhelmus P. J. Classens, Castenray (NL); Henricus C. M. Van Genuchten, Eindhoven (NL); Evgenij V. Kuznetsov, Venlo (NL)

(73) Assignee: Oce-Technologies B.V., Venlo (NL)

( * ) Notice: Subject to any disclaimer, the term of this patent is extended or adjusted under 35 U.S.C. 154(b) by 70 days.

(21) Appl. No.: 13/111,587

(22) Filed: May 19, 2011

(65) Prior Publication Data
US 2011/0233239 A1  Sep. 29, 2011

Related U.S. Application Data

(63) Continuation of application No. PCT/EP2009/065372, filed on Nov. 18, 2009.

(30) Foreign Application Priority Data

Dec. 2, 2008 (NL) ................................ 1036267

(51) Int. Cl.
*B22D 41/00* (2006.01)
*B67D 7/00* (2010.01)

(52) U.S. Cl.
USPC ............................. 222/591; 222/593; 266/236

(58) Field of Classification Search
None
See application file for complete search history.

(56) References Cited

U.S. PATENT DOCUMENTS

| | | | |
|---|---|---|---|
| 5,377,961 A | 1/1995 | Smith et al. | |
| 5,598,200 A * | 1/1997 | Gore | ............................... 347/88 |
| 5,810,988 A | 9/1998 | Smith, Jr. et al. | |
| 5,876,615 A | 3/1999 | Predetechensky | |
| 7,449,703 B2 | 11/2008 | Bykanov | |

FOREIGN PATENT DOCUMENTS

| | | |
|---|---|---|
| EP | 0 491 599 A1 | 6/1992 |
| GB | 2 154 902 A | 9/1985 |
| JP | 2004-317096 | * 11/2001 |

OTHER PUBLICATIONS

International Search Report, PCT/EP2009/065372, May 10, 2010.
Written Opinion, PCT/ISA/237; PCT/EP2009/065372, May 10, 2010.

* cited by examiner

*Primary Examiner* — Lois Zheng
(74) *Attorney, Agent, or Firm* — Birch, Stewart, Kolasch & Birch, LLP

(57) ABSTRACT

In a jetting device for ejecting droplets of a relatively hot fluid, a fluid chamber body is made of a heat resistant material and an inner surface of the fluid chamber body, the inner surface defining a fluid chamber of the jetting device, is wettable by the fluid. This configuration provides that no additional force needs to be applied for forcing the fluid into an orifice, i.e. a narrow tube leading towards a nozzle.

19 Claims, 3 Drawing Sheets

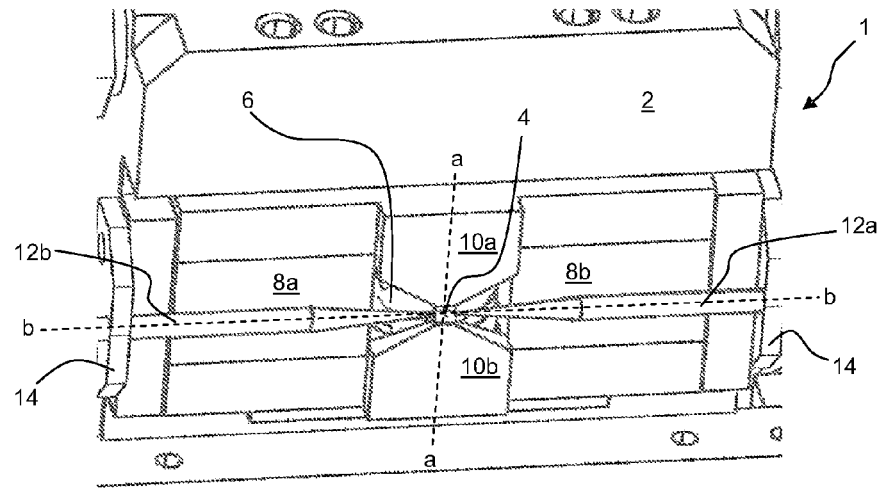
Fig. 1
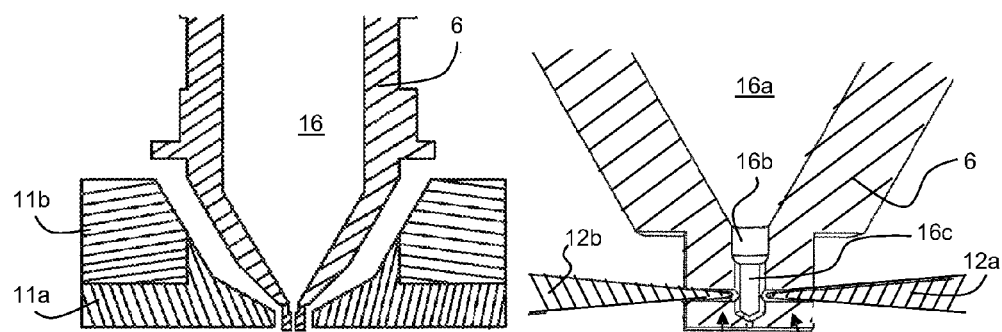
Fig. 2a
Fig. 2c
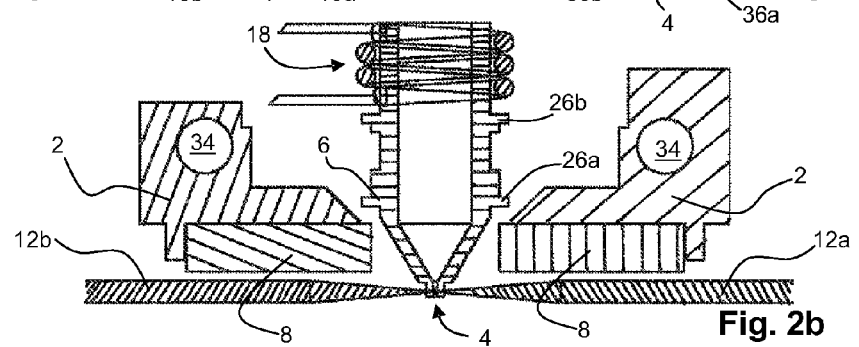
Fig. 2b

DEVICE FOR EJECTING DROPLETS OF A FLUID HAVING A HIGH TEMPERATURE

This application is a Continuation of PCT International Application No. PCT/EP2009/065372 filed on Nov. 18, 2009, which claims the benefit of Patent Application No. 1036267 filed in The Netherlands on Dec. 2, 2008. The entire contents of all of the above applications are hereby incorporated by reference into the present application.

The present invention relates to a device for ejecting droplets of a fluid having a high temperature such as a molten metal or a molten semiconductor.

From U.S. Pat. No. 5,377,961 it is known that a molten metal, such as solder, may be ejected in relatively small droplets using a force well known as a Lorentz force. The Lorentz force results from an electric current flowing through the metal, while being arranged in a magnetic field. A direction and magnitude of the resulting force is related to the cross product of the electric current and the magnetic field vector: $\vec{F} = \vec{I} \times \vec{B}$.

The device disclosed in U.S. Pat. No. 5,377,961 is however only described for ejecting droplets of solder, which has a relatively low melting temperature (about 500 K). For ejecting droplets of metals having a higher melting temperature (e.g. higher than about 1200 K), such as gold, silver, copper, titanium and the like, the device needs to be specifically configured to be able to operate at such high temperatures.

Further a molten metal may not flow through the orifice of the jetting device and a constant force may be required for forcing the molten metal into the orifice enabling the molten metal to be ejected. In an known jetting device, such a force is provided by exerting a substantially constant gas pressure on the molten metal. However, applying such a force requires further (costly) equipment and renders the assembly complex.

Further, it is known from U.S. Pat. No. 5,876,615 that a fluid chamber body may be a single replaceable unit, e.g. being a disposable or being refillable. The fluid chamber body as disclosed in U.S. Pat. No. 5,876,615 is made of a ceramic material sealed with glaze (melted glass). Such a seal may be suitable for printing solder having a relatively low melting temperature, for printing metals like gold, silver, copper and the like, glaze is not suitable since its melting temperature is of a same magnitude, which would result in melting of the glaze, thereby rendering the fluid chamber wall non-wettable and thereby the jetting device inoperable as above described.

In order to provide an economically feasible jetting device such a replaceable fluid chamber body should be cost-effective. Therefore, it is an object of the present invention to provide a simple fluid jet device having a replaceable fluid chamber body and being configured to eject droplets of a fluid having a relatively high temperature.

The above object is achieved in a device according to claim 1.

The device according to the present invention comprises a replaceably arranged fluid chamber body defining a fluid chamber and having an orifice extending from the fluid chamber to an outer surface of the fluid chamber element. A droplet of the fluid may be expelled from the fluid chamber through the orifice. An actuation means is provided for generating a pressure force in the fluid for ejecting a droplet of the fluid from the fluid chamber and through the orifice. In accordance with the present invention, the fluid chamber body is made of a heat-resistant material, the material being wettable by the fluid to be ejected.

As apparent from the requirements of a device for ejecting droplets of a hot fluid, the body forming the fluid chamber and holding the hot fluid needs to be heat resistant, in particular resistant to the heat of molten metals. Preferably the body is resistant to temperatures up to 3000 K, which enables to handle a large range of metals. Further, the material is preferably cost-effectively machinable. Also, it may be preferred that the material is resistant against corrosion by the molten metals. Furthermore, the material of the fluid chamber, in particular at the orifice, is wettable by the fluid. If the fluid does not wet on the material, the fluid will contract itself and bead and consequently will not flow through the orifice when no (external) force is exerted on the fluid. By ensuring that the fluid chamber body is wettable by the fluid, the fluid will flow into the orifice without an additional force. Moreover, in an embodiment and due to the dimensions of the orifice, a capillary force may stimulate the flow into and through the orifice.

It is noted that, hereinafter, the fluid to be ejected from the device is described to be a molten metal. However, the device as claimed may as well be employed for jetting other relatively warm fluids. If other kind of fluids are used, of course, the device needs to be adapted for such a fluid. For example, hereinafter, it is described that the fluid is ejected by using a Lorentz force generated in and exerted on the fluid. However, in case the fluid is not electrically conductive, no Lorentz force can be generated and another kind of actuation is to be used. Also, other adaptations may be needed.

The fluid chamber body is—in accordance with the present invention—replaceably arranged. Thus, a simple cost-effective fluid chamber body may be provided having a suitable properties for the fluid to be ejected from the fluid chamber. As the fluid chamber body is replaceable, a fluid supply assembly may be omitted as the fluid (possibly in a solid state) may be provided in the fluid chamber outside of the jetting device. The fluid chamber body holding the solid metal, for example, may then be arranged in the jetting device and in the jetting device, the metal may be heated to become a fluid such that it may be jetted. The omission of a fluid supply assembly may be advantageous as the fluid metal has a relatively high temperature requiring a relatively expensive supply assembly.

The replaceable fluid chamber body further enables to enable the use of the jetting device for printing a number of different metals. By simply replacing the fluid chamber body holding a first metal by a fluid chamber body holding a second metal, the jetting device may be employed for jetting different metals and/or other materials. Moreover, the fluid chamber body may be selected to be dedicated to the specific metal or other fluid held in the fluid chamber body for providing good flow and jetting properties for each different material.

In an embodiment, the fluid chamber body comprises an electrically conductive material, which may be advantageously employed with inductive heating of a metal to be jetted, since the material of the fluid chamber body will be heated resulting in a more efficient heating. In a particular embodiment, the material comprises graphite, which is cost-effectively machinable, has a high melting temperature and is wettable by e.g. alkali metals, sodium (Na), lithium (Li) and titanium (Ti).

In another embodiment, the material of the fluid chamber body is not electrically conductive. This may be advantageous for preventing an electrical actuation current flowing into the fluid chamber body, since such a flow into the body material might decrease a generated actuation force. In a particular embodiment, the fluid body chamber comprises boron-nitride (BN).

In an embodiment, at least an inner surface of the fluid chamber body, the inner surface defining the fluid chamber, is provided with a wetting coating. The wetting coating is wettable for the fluid. Preferably, the coating is wettable by a relatively large range of fluid materials. In an embodiment for jetting molten metals, the wetting coating may comprise at least one of mono-tungsten-carbide, di-tungsten-carbide and tri-tungsten-carbide (WC, $W_2C$ and $W_3C$). In a preferred embodiment, tri-tungsten-carbide ($W_3C$) is comprised in the wetting coating. Tungsten carbide is wettable by a relatively large number of metals, including metals like gold, silver and copper (Au, Ag, Cu, respectively). In another embodiment, the inner surface is provided with a metallic coating. It is known that many molten metals are wetting on a metallic surface. Consequently, a metallic coating may be a suitable coating. The coating—e.g. a coating comprising tungsten-carbide or a metallic coating—may be provided by chemical vapor deposition (CVD).

In an embodiment, no wetting coating is provided at an outer surface of the fluid chamber body, in particular at a part of the outer surface directly surrounding an opening of the orifice. An amount of fluid remaining around the orifice opening may disturb droplet ejection. Omitting a wetting coating may render the outer surface non-wetting, thereby preventing that an amount of fluid may remain at the outer surface near the orifice opening. In a particular embodiment, a non-wetting coating is provided at the outer surface directly surrounding the opening of the orifice.

In an embodiment, the actuation means comprises at least two electrically conductive electrodes, each electrode being arranged such that one end of each electrode is in electrical contact with the fluid in the fluid chamber. Thus, an electrical current may be generated in the fluid. The current generated in the fluid, which fluid is arranged in a magnetic field, may cause a force. A suitably arranged magnetic field in combination with a suitably generated current causes the force to be directed and to have an amplitude sufficient to force a droplet of fluid through the orifice.

In a particular embodiment, the electrodes are pin-shaped and wherein an electrode is arranged in a through hole in the fluid chamber body, the through hole extending from an outer surface into the fluid chamber. This provides a simple and effective arrangement for having the electrode making electrical contact with the fluid.

In a particular embodiment, an end of the electrode extending through the through hole is conically shaped and wherein an elastic force is exerted on the pin-shaped electrode such that a fluid tight connection between the electrode and the fluid chamber body is obtained. The conical shape being forced into the through hole results in a tight connection preventing leakage of the fluid from the fluid chamber through the holes accommodating the electrodes. Moreover, having the elastic force exerted on the electrode, when the fluid chamber body and/or the electrode expands/contracts due to relatively large temperature changes, the tight connection is maintained. Further, such elastically arranged electrodes enables to easily disconnect the electrodes from the fluid chamber body for replacing the fluid chamber body and connecting the electrodes to another fluid chamber body such that a leakage-free coupling is obtained.

In an embodiment, the elastic force is provided by a spring, the spring being electrically isolated by a layer of electrically-isolating and heat-conducting material such as aluminum-nitride (AlN). The spring force is electrically isolated to prevent electrical current leakage to other parts of the device, while the heat conductivity is important to prevent that the springs become relatively warm, since the spring force would decrease due to such a high temperature of the spring.

In an embodiment, the magnetic field is provided by a permanently magnetized material, the magnetic field being concentrated at the fluid chamber using a magnetic concentrator made of magnetic field guiding material such as iron. In particular, the magnetic material is NdFeB and the magnetic material may be thermally isolated and/or cooled in order to prevent partial or total loss of magnetization due to a (too) high temperature of the material.

In an embodiment, the device further comprises a support frame. In this embodiment, the fluid chamber body is supported by the support frame by a support plate. The support plate may be rigid in at least one dimension and comprises a thermally-isolating and electrically-isolating material such as boron-nitride (BN) and/or alumina ($Al_2O_3$). Thus, the fluid chamber body is both thermally and electrically isolated from the remaining parts of the device. Considering the relatively high temperature that may occur in use, it is prevented that other parts become too warm and it is prevented that heat energy is lost to parts of the device that are not required to be heated. A similar consideration is applicable to the electrical isolation, preventing loss of electrical current and preventing to charge other parts of the device.

In an embodiment, the material of the fluid comprises a metal and the fluid chamber body is arranged in a center of a coil, the coil being configured to carry an electrical current for inducing an inductive current in the material of the fluid and/or the material of the fluid chamber body for heating the material of the fluid. The metal arranged in a current-carrying coil results in inductive heating of the metal. This is an effective and quick method for heating the fluid.

It is noted that wetting and wettability as used herein is intended to mean that the fluid has a relatively small contact angle with the wettable material.

Hereinafter, the present invention is elucidated with reference to the appended drawings showing non-limiting embodiments and wherein:

FIG. 1 shows a perspective view of a part of an embodiment of the device according to the present invention;

FIG. 2a shows a cross-sectional view of a part of the embodiment of FIG. 1;

FIG. 2b shows a cross-sectional view of a part of the embodiment of FIG. 1;

FIG. 2c shows a cross-sectional view of a part of the embodiment of FIG. 1;

Figure 3A:
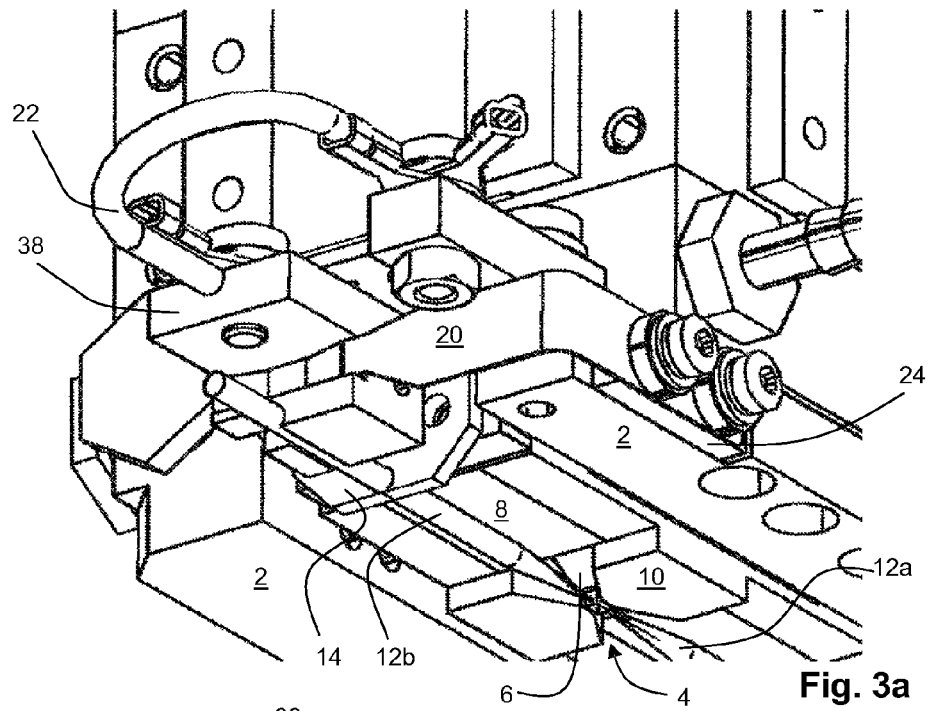
FIG. 3a shows a perspective view of a part of the embodiment of FIG. 1.

In the drawings, same reference numerals refer to same elements. FIG. 1 shows a part of a jetting device 1 for ejecting droplets of a relatively hot fluid, in particular a molten metal such as copper, silver, gold and the like. The jetting device 1 comprises a support frame 2, made of a heat resistant and preferably heat conductive material. As described hereinafter, the support frame 2 is cooled by a cooling liquid. A good heat conductivity increases the heat distribution through the support frame 2 and thereby increases a spreading of the heat. Further, the support frame 2 is preferably configured to absorb only a relatively small amount of heat from any of the heated parts of the jetting device 1. For example, the support frame 2 may be made of aluminum and be polished such that the aluminum reflects a relatively large amount, e.g. 95% or even more, of the heat radiation coming from any hot parts of the jetting device 1.

The jetting device 1 is provided with an ejection nozzle 4 through which a droplet of the fluid may be ejected. The nozzle or orifice 4 is a through hole extending through a wall of a fluid chamber body 6. In the fluid chamber body 6 a fluid chamber is arranged. The fluid chamber is configured to hold the fluid. Consequently, the fluid chamber body 6 needs to be heat resistant. Further, the fluid chamber body 6 is made such that the fluid, such as a molten metal, is enabled to flow over a surface, in particular an inner surface of the fluid chamber body 6, the inner surface forming a wall of the fluid chamber. Also, an inner wall of the through hole forming the orifice 4 needs to be wetting for the fluid in order to enable the fluid to flow through the orifice 4. It is noted that this even more relevant compared to known fluid jet devices such as inkjet devices, since molten metals generally have a relatively high surface tension due to which molten metals tend to form beads. Such beads will generally not flow through a small hole such as the orifice 4. If the surface of the fluid chamber body 6 is wetting with respect to the fluid, the fluid will not tend to form beads, but will easily spread and flow over the surface and is thus enabled to flow into and through the orifice 4.

The fluid chamber body 6 is replaceably arranged as shown in more detail in e.g. FIGS. 2b and 4 as described hereinafter. Further, it is noted that the fluid chamber body 6 is preferably made cost-effectively such that a replaceable fluid chamber body 6 is economically feasible. Further, for example, as molten metals tend to chemically react with oxygen, after molten metals have been ejected from the fluid chamber body 6, the fluid chamber body 6 may not be reusable when left in air, because metal remaining in the fluid chamber will most probably react with oxygen. Oxidized metals tend to block the orifice 4 and/or change the wettability characteristics of the fluid chamber wall, thereby rendering the jetting device 1 unusable for further ejecting.

For ejecting droplets of molten metal, the jetting device 1 is provided with two permanent magnets 8a, 8b (hereinafter also referred to as magnets 8). The magnets 8 are arranged between two magnetic field concentrating elements 10a, 10b (hereinafter also referred to as concentrators 10) made of magnetic field guiding material such as iron. The jetting device 1 is further provided with two electrodes 12a, 12b (hereinafter also referred to as electrodes 12) both extending into the fluid chamber body 6 through a suitable through hole such that at least a tip of each of the electrodes 12 is in direct electrical contact with the molten metal present in the fluid chamber. The electrodes 12 are supported by suitable electrode supports 14 and are each operatively connected to a suitable electrical current generator (not shown) such that a suitable electrical current may be generated through the electrodes 12 and the molten metal present between the tips of the electrodes 12.

The magnets 8 and the concentrators 10 are configured and arranged such that a relatively high magnetic field is obtained at and near the position of the orifice 4, in particular in the molten metal at the location between the two respective tips of the two electrodes 12a, 12b. As indicated in the introductory part hereof, the combination of an electrical current and the magnetic field results in a force exerted on the molten metal, which may result in a droplet of molten metal being pushed through the orifice 4, thereby ejecting a droplet.

The permanent magnets 8 are thermally isolated from the fluid chamber body 6 at least to the extent that the temperature of the magnets 8 does not exceed a predetermined threshold temperature. This threshold temperature is predetermined based on the temperature above which the magnets 8 may partially or totally loose their magnetization. For example, using permanent magnets 8 made of NdFeB, such a threshold temperature may be about 80° C. In order to achieve such a low temperature, in an embodiment, the magnets 8 may also be actively cooled e.g. using suitable cooling means, such as a cooling liquid.

The electrodes 12 are made of a suitable material for carrying a relatively high current, while being resistant against high temperatures. The electrodes 12 may be suitably made of tungsten (W), although other suitable materials are contemplated.

FIGS. 2a-2c further illustrates the fluid chamber body 6 having the fluid chamber 16 as an interior space. FIG. 2a shows a cross-section of the embodiment illustrated in FIG. 1, which cross-section is taken along line a-a (FIG. 1). FIGS. 2b-2c show a cross-section of the embodiment illustrated in FIG. 1, which cross-section is taken along line b-b (FIG. 1).

In FIG. 2a, the fluid chamber 16 is shown. The interior wall of the fluid chamber body 6 defining the fluid chamber 16 is in accordance with the present invention wetting with respect to the fluid to be ejected through the orifice 4. For example, the fluid chamber body 6 is made of graphite and the fluid to be ejected is molten titanium (Ti). In another embodiment, the fluid to be ejected is gold (Au), silver (Ag) or copper (Cu). These metals do not wet on graphite and therefore tend to form beads. Such beads cannot be ejected through the orifice 4 without application of an additional force such as a gas pressure. In accordance with the present invention, the interior wall forming the fluid chamber 16 is therefore suitably coated. In a particular embodiment, the coating comprises tungsten-carbide (WC, $W_2C$, $W_3C$). The coating may be provided by chemical vapor deposition (CVD), for example. A coating comprising tungsten-carbide is wetting for a large number of molten metals and is therefore very suitable. Other suitable embodiments of coatings include chrome-carbide ($Cr_xC_y$). Chrome-carbide is wetting for copper (Cu) and has a relatively low melting temperature. So, although a suitable embodiment of a coating in accordance with the present invention, it is only suitable for use with a limited number of metals.

In an embodiment, at an outer surface, in particular around the orifice 4, the surface is non-wetting for the fluid to be ejected in order to prevent ejection disturbances due to fluid present around the orifice 4. If the above-mentioned wetting coating is also provided at the outer surface, it may be preferable to remove the wetting coating around the orifice 4.

Further, with reference to FIG. 2a and FIG. 1, it is shown that the concentrators 10a, 10b are each comprised—in the illustrated embodiment—of at least two parts. For example, the concentrator 10a comprises a first part 11a and a second part 11b. The first part 11a extends substantially in the direction of line a-a. The first part 11a has a form and shape such that the magnetic field is concentrated near the orifice 4. The second part 11b extends substantially in the direction of line b-b and is configured to guide the magnetic field of the magnets 8 to the first part 11a, thus resulting in the magnetic field of the magnets 8 being guided to and being concentrated at the orifice 4. Of course, the first and the second parts 11a, 11b may be separate elements or may each be a portion of a single element.

Now referring to FIGS. 2b and 2c, the support frame 2 and the magnets 8 are shown. In the illustrated embodiment, the support frame 2 is provided with cooling channels 34 through which a cooling liquid may flow for actively cooling of the support frame 2 and the magnets 8. An induction coil 18 is shown. The fluid chamber body 6 is arranged in a center of the induction coil 18 such that a current flowing through the induction coil 18 results in heating of a metal arranged in the fluid chamber 16. Due to such heating the metal may melt and thus become a fluid. Such inductive heating ensures a power-efficient heating and no contact between any heating element and the fluid, limiting a number of (possible) interactions between elements of the jetting device 1 and the fluid.

In an embodiment the fluid chamber body 6 is made of a material that is heated by inductive heating. As above mentioned, this increases the heating efficiency and in particular decreases a time period needed for melting a metal present in the fluid chamber in a solid state.

In FIG. 2b, it is shown that the fluid chamber body 6 is provided with a first ridge 26a and a second ridge 26b. These ridges 26a, 26b are provided for enabling a supporting coupling suitable for easily replacing the fluid chamber body 6, as is shown in more detail in FIG. 4.

FIGS. 2b and 2c further show the two electrodes 12a, 12b each having a conically shaped end. These conically shaped ends extend into the fluid chamber 16 through suitable electrode passages 36a, 36b, respectively. In particular, referring to FIG. 2c, the fluid chamber 16 is divided in a fluid reservoir 16a, a fluid passage 16b and an actuation chamber 16c. The ends of the electrodes 12 are arranged such that the ends are in direct electrical contact with the metal fluid in the actuation chamber 16c. As apparent from FIG. 2c, the conically shaped tip end of each electrode 12a, 12b has a smaller diameter than the respective electrode passages 36a, 36b, while the diameter of the electrodes 12a, 12b increase to a diameter that is substantially larger than the diameter of the respective electrode passages 36a, 36b such that tip ends of the electrodes 12a, 12b can be arranged in the electrode passages 36a, 36b such that each electrode passage 36a, 36b may be liquid tightly closed by the respective electrodes 12a, 12b, while the end of the electrodes 12a, 12b are each in contact with the fluid. As apparent to those skilled in the art, the diameters of the electrodes 12a, 12b and the electrode passages 36a, 36b may be suitably selected such that the electrode ends do not touch each other, while fluid tight closure of the electrode passages 36a, 36b is obtained and maintained in operation.

In order to maintain a fluid tight closure of the electrode passages 36a, 36b, in an embodiment, a spring force is exerted on the electrodes 12, forcing the electrodes 12 into the fluid chamber 16. When the temperature of the fluid chamber body 6 and the electrodes 12 increases during operation, the dimensions of the different parts being made of different materials changes. Using the elastic force, e.g. provided by a spring, it is prevented that any change in diameter of the electrode passages 36a, 36b and any change in diameter of the electrodes 12 may result in leakage of fluid through the electrode passages 36a, 36b. It is noted that such a leakage results in a decrease of the pressure generated by an actuation and thus results in a decreased actuation efficiency.

FIG. 3a illustrates an embodiment in which an elastic force is exerted on the electrodes 12 using a spring 20. The spring 20 is supported by the support frame 2, while an electrically isolating body 24 is arranged between the spring 20 and the support frame 2 for preventing that electrical current from the electrode 12b is enabled to flow through the spring 20 to the support frame 2. Further, the body 24 is thermally conductive in order to keep the spring 20 at a low temperature by the good thermal contact with the relatively cold support frame 2. It may be important to maintain the temperature of the spring 20 relatively low, since the spring force of the spring 20 may decrease, if the temperature becomes above a predetermined temperature, as is well known in the art. A suitable material for the electrically isolating and thermally conductive body 24 may be aluminum-nitride (AlN).

The spring 20 is connected to a coupling element 38, the coupling element 38 further being connected to the electrode 12b. Thus, the spring 20 is enabled to exert its spring force on the electrode 12b through the coupling element 38. The coupling element 38 may further be employed to provide a suitable electrical coupling to the current generator, e.g. using an electrical conductive wire 22.

Figure 3B:
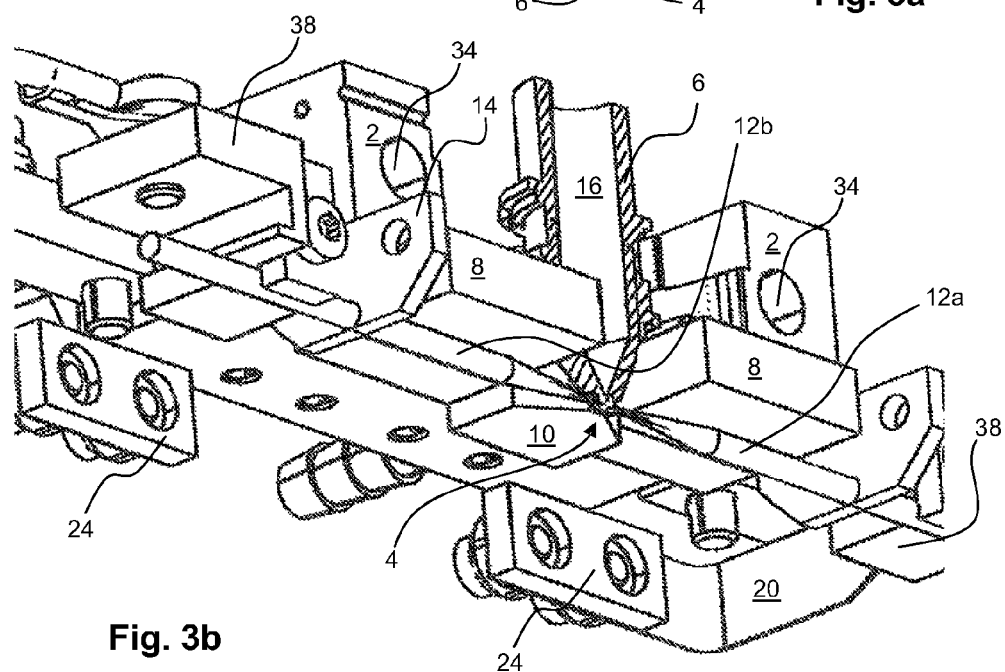
FIG. 3b shows a perspective and partially cross-sectional view of a part of the embodiment of FIG. 1.

FIG. 3b shows a substantially similar perspective view as shown in FIG. 3a, except that a number of parts is removed and the fluid chamber body 6 is shown in cross-section, thereby showing the fluid chamber 16.

Figure 4:
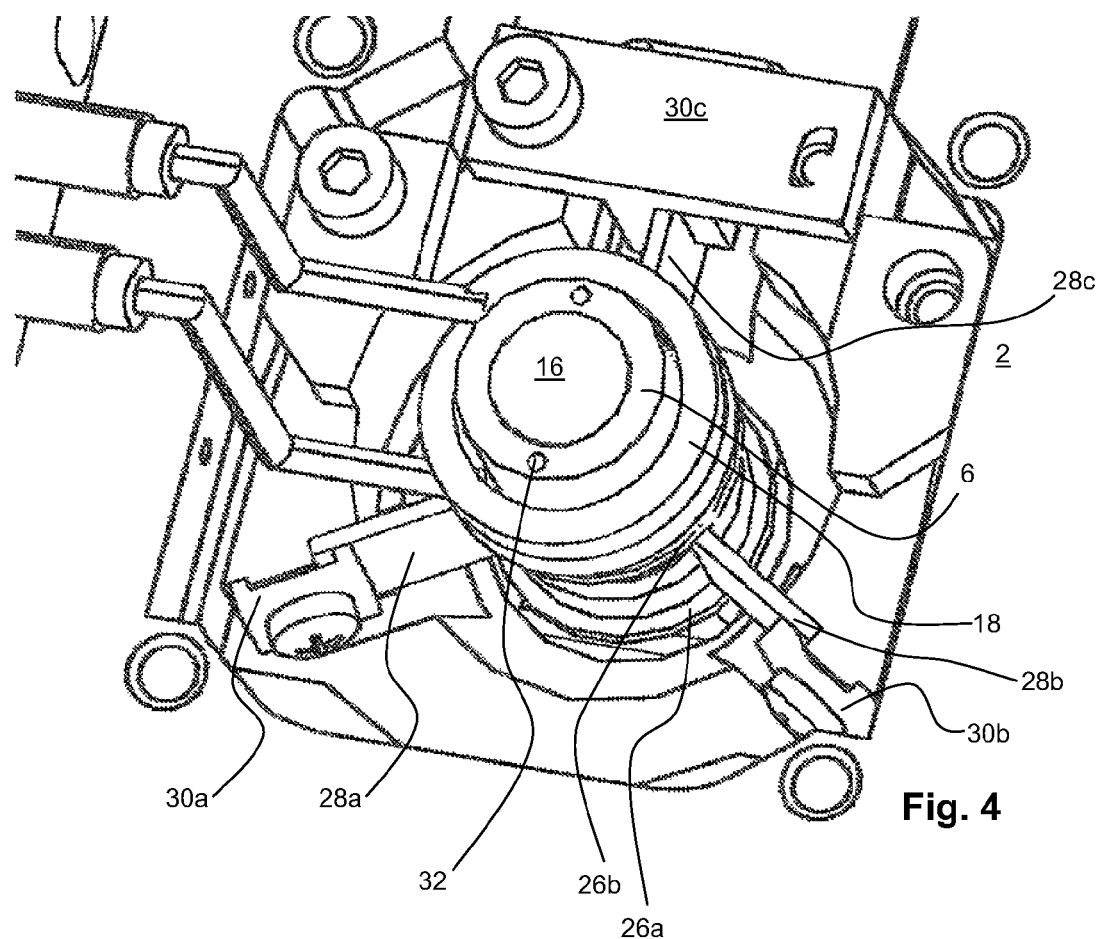
FIG. 4 shows a perspective view of a part of the embodiment of FIG. 1.

FIG. 4 shows a perspective top view of the support frame 2 supporting the fluid chamber body 6. Around the fluid chamber body 6 defining the fluid chamber 16 the inductive coil 18 is arranged. The fluid chamber body 6 is supported by three support elements 28a, 28b, 28c. The support elements 28a, 28b, 28c have a dimension substantially equal to a distance between the first ridge 26a and the second ridge 28b of the fluid chamber body 6. The three support elements 28a, 28b, 28c are each embodied as a rigid support plate. The three support elements 28a, 28b, 28c are arranged around the fluid chamber body 6 at angles of substantially 60° relative to each other. Thus, the fluid chamber body 6 may be clamped between the support elements 28a, 28b, 28c. The support elements 28a, 28b, 28c are clamped between the support frame 2 and respective clamps 30a, 30b, 30c, which allow the support elements 28a, 28b, 28c to be released both for easily removing and for easily introducing and positioning the fluid chamber body 6 such that the orifice 4 is positioned between the magnetic field concentrators 10. The support elements 28a, 28b, 28c preferably isolate the fluid chamber body 6 from the support frame 2 both electrically and thermally. Therefore, the support elements 28a, 28b, 28c may be suitable made of alumina ($Al_2O_3$) or boron-nitride (BN).

FIG. 4 further shows holes 32 in the wall of the fluid chamber body 6 which have a suitable size for introducing a suitable thermocouple (or any other suitable temperature sensing element) for enabling to determine an actual temperature of the fluid chamber body 6 for controlling heating of the fluid and/or fluid chamber body 6.

Detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. In particular, features presented and described in separate dependent claims may be applied in combination and any combination of such claims are herewith disclosed.

Further, the terms and phrases used herein are not intended to be limiting; but rather, to provide an understandable description of the invention. The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly.

The invention claimed is:

1. Device for ejecting droplets of a fluid, the fluid having a temperature higher than about 1200K, the device comprising:

a replaceably arranged fluid chamber body defining a fluid chamber and having an orifice extending from the fluid chamber to an outer surface of the fluid chamber body; and an actuation device configured to eject a droplet of the fluid from the fluid chamber and through the orifice;

wherein the fluid chamber body is made of a heat-resistant material, the heat-resistant material being wettable by the fluid, and wherein at least an inner surface of the fluid chamber body is provided with a wetting coating, the wetting coating being wettable for the fluid, and an inner surface of the orifice is wettable to the fluid.

2. Device according to claim 1, wherein the heat-resistant, wettable material is substantially electrically conductive.

3. Device according to claim 2, wherein the heat-resistant, wettable material comprises at least one of graphite and a metal.

4. Device according to claim 1, wherein the heat-resistant, wettable material is not substantially electrically conductive.

5. Device according to claim 4, wherein the heat-resistant, wettable material comprises boron-nitride (BN).

6. Device according to claim 1, wherein the fluid is a molten metal and wherein the wetting coating comprises at least one of mono-tungsten-carbide, di-tungsten-carbide and tri-tungsten-carbide (WC, $W_2C$ and $W_3C$).

7. Device according to claim 6, wherein the wetting coating comprising Tungsten-carbide (WC, $W_2C$ and/or $W_3C$) is provided by chemical vapor deposition (CVD).

8. Device according to claim 1, wherein no wetting coating is present at the outer surface of the fluid chamber body around the orifice.

9. Device according to claim 1, wherein the actuation device comprises at least two electrically conductive electrodes, each electrode being arranged such that one end of each electrode is in electrical contact with the fluid in the fluid chamber.

10. Device according to claim 9, wherein the electrodes are pin-shaped and wherein an electrode is arranged in a through hole in the fluid chamber body, the through hole extending from an outer surface into the fluid chamber.

11. Device according to claim 10, wherein an end of the electrode extending through the through hole is conically shaped and wherein an elastic force is exerted on the pin-shaped electrode such that a fluid tight connection between the electrode and the fluid chamber body is obtained.

12. Device according to claim 11, wherein the elastic force is provided by a spring, the spring being electrically isolated by a layer of electrically-isolating and heat-conducting material such as aluminum-nitride (AlN).

13. Device according to claim 1, wherein the fluid chamber is at least partly arranged in a magnetic field, the magnetic field being obtained from a magnetic material and being concentrated at the fluid chamber using an iron concentrator element.

14. Device according to claim 13, wherein the magnetic material is NdFeB and the magnetic material being suitably cooled and thermally isolated.

15. Device according to claim 1, wherein the device further comprises a support frame, the fluid chamber body being supported by the support frame by a support plate, the support plate being rigid in at least one dimension and comprising a thermally-isolating and electrically-isolating material such as boron-nitride (BN) and/or alumina ($Al_2O_3$).

16. Device according to claim 15, wherein the fluid chamber is at least partly arranged in a magnetic field, the magnetic field being obtained from a magnetic material and being concentrated at the fluid chamber using an iron concentrator element and wherein a number of support plates support the fluid chamber body, the support plates being arranged for positioning the fluid chamber body such that the fluid chamber is positioned in the concentrated magnetic field.

17. Device according to claim 1, wherein the material of the fluid comprises a metal and wherein the fluid chamber body is arranged in a center of a coil, the coil being configured to carry an electrical current for inducing an inductive current in the material of the fluid for heating the material of the fluid.

18. Device according to claim 1, wherein the wetting coating comprises tri-tungsten-carbide ($W_3C$).

19. Fluid chamber body defining a fluid chamber and having an orifice extending from the fluid chamber to an outer surface of the fluid chamber body, the fluid chamber body being configured to be arranged in the device according to claim 1, the fluid chamber body being made of a heat-resistant material, the heat-resistant material being wettable by the fluid, wherein at least an inner surface of the fluid chamber body is provided with a wetting coating, the wetting coating being wettable for the fluid.

* * * * *